(12) United States Patent
Benwadih et al.

(10) Patent No.: US 10,615,033 B2
(45) Date of Patent: Apr. 7, 2020

(54) ELECTRONIC DEVICE AND PRODUCTION METHOD THEREOF

(71) Applicant: Commissariat à l'Énergie Atomique et aux Énergies Alternatives, Paris (FR)

(72) Inventors: Mohammed Benwadih, Champigny sur Marne (FR); Romain Coppard, Voiron (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 15/328,395

(22) PCT Filed: Jul. 23, 2015

(86) PCT No.: PCT/FR2015/052042
§ 371 (c)(1),
(2) Date: Jan. 23, 2017

(87) PCT Pub. No.: WO2016/016554
PCT Pub. Date: Feb. 4, 2016

(65) Prior Publication Data
US 2017/0213728 A1 Jul. 27, 2017

(30) Foreign Application Priority Data

Jul. 29, 2014 (FR) .................................. 14 57328

(51) Int. Cl.
*H01L 21/02* (2006.01)
*H01L 29/786* (2006.01)
(Continued)

(52) U.S. Cl.
CPC .. *H01L 21/02628* (2013.01); *H01L 21/02172* (2013.01); *H01L 21/02205* (2013.01);
(Continued)

(58) Field of Classification Search
None
See application file for complete search history.

(56) References Cited

U.S. PATENT DOCUMENTS

| 6,172,152 B1 * | 1/2001 | Kim .................... C08L 83/12 524/104 |
| 2006/0003485 A1 | 1/2006 | Hoffman et al. |

(Continued)

FOREIGN PATENT DOCUMENTS

JP 2002-076356 A 3/2002

OTHER PUBLICATIONS

International Preliminary Report on Patentability for Application No. PCT/FR2015/052042 dated Jan. 31, 2017.
(Continued)

*Primary Examiner* — Davienne N Monbleau
*Assistant Examiner* — Scott R Wilson
(74) *Attorney, Agent, or Firm* — Wolf, Greenfield & Sacks, P.C.

(57) ABSTRACT

An electronic device having at least a first portion including a metal oxide that is in contact with a second portion including the said metal oxide, the first portion being semi-conducting and the second portion being electrically insulating.

11 Claims, 3 Drawing Sheets

(51) Int. Cl.
    *H01L 29/22*     (2006.01)
    *H01L 29/24*     (2006.01)
    *H01L 29/51*     (2006.01)
    *H01L 29/66*     (2006.01)
    *H01L 29/94*     (2006.01)
    *H01L 29/49*     (2006.01)

(52) U.S. Cl.
    CPC .. *H01L 21/02282* (2013.01); *H01L 21/02348* (2013.01); *H01L 21/02554* (2013.01); *H01L 21/02565* (2013.01); *H01L 29/22* (2013.01); *H01L 29/24* (2013.01); *H01L 29/4908* (2013.01); *H01L 29/517* (2013.01); *H01L 29/66969* (2013.01); *H01L 29/7869* (2013.01); *H01L 29/94* (2013.01)

(56) References Cited

U.S. PATENT DOCUMENTS

| | | | | |
|---|---|---|---|---|
| 2007/0037346 A1* | 2/2007 | Grant | H01G 4/33 | 438/243 |
| 2007/0098905 A1* | 5/2007 | Gaudon | C23C 18/1216 | 427/376.2 |
| 2008/0291350 A1* | 11/2008 | Hayashi | H01L 27/1225 | 349/47 |
| 2009/0159880 A1* | 6/2009 | Honda | H01L 29/7869 | 257/43 |
| 2013/0165313 A1* | 6/2013 | Kijima | C01G 23/002 | 501/135 |
| 2013/0256582 A1* | 10/2013 | Doi | C23C 18/1216 | 252/62.56 |
| 2014/0072720 A1* | 3/2014 | Watkins | H01L 51/0015 | 427/487 |
| 2014/0217396 A1* | 8/2014 | Imamura | H01L 27/1225 | 257/43 |
| 2014/0346495 A1* | 11/2014 | Shieh | H01L 29/66742 | 257/43 |
| 2015/0028331 A1* | 1/2015 | Seol | H01L 29/78693 | 257/43 |

OTHER PUBLICATIONS

International Search Report for Application No. PCT/FR2015/052042 dated Oct. 29, 2015.

\* cited by examiner

ELECTRONIC DEVICE AND PRODUCTION METHOD THEREOF

This application is the national phase of International Application No. PCT/FR2015/052042, filed on Jul. 23, 2015, which claims priority to French Application No. 14/57328, filed on Jul. 29, 2014, which applications are incorporated herein by reference to the maximum extent allowable by law.

BACKGROUND

The present application relates to an electronic component and to a method of manufacturing the same.

DISCUSSION OF THE RELATED ART

Certain electronic components of an electronic device comprise a semiconductor portion in contact with an insulating portion. An example of such an electronic component corresponds to a field-effect transistor where the insulating portion corresponds to the gate insulator and where the channel is formed in the semiconductor portion. Another example of an electronic component corresponds to a metal-insulator-semiconductor capacitor. Another example of an electronic component corresponds to semiconductor material tracks laterally insulated from one another by an insulating material.

Certain properties of the electronic device may depend on the state of the interface between the semiconductor portion and the insulating portion. It is generally desirable for the interface between the semiconductor portion and the insulating portion to have as few defects as possible.

When the electronic device manufacturing method is a dry process, the semiconductor portion and the insulating portion may be formed by physical vapor deposition or PVD or by chemical vapor deposition or CVD. Such methods require using a reactor where a partial vacuum is formed. An interface of good quality can generally be obtained between the insulating portion and the semiconductor portion.

The forming of electronic devices by wet processes, particularly by sol-gel methods, does not require using a reactor and advantageously enables to form large structures. Further, sol-gel methods may be implemented at the atmospheric pressure and enable to accurately control the composition of the obtained layers.

A disadvantage of wet manufacturing processes is that the interfaces between the insulating portion and the semiconductor portion may comprise a significant number of defects.

SUMMARY

An object of an embodiment aims at overcoming all or part of the disadvantages of the previously-described electronic devices comprising a semiconductor portion and an insulating portion and of their manufacturing methods.

Another object of an embodiment is for the semiconductor portion and the insulating portion to be formed by wet manufacturing processes.

Another object of an embodiment is for the interface between the semiconductor portion and the insulating portion to comprise few defects.

Thus, an embodiment provides an electronic device comprising at least a first portion based on a metal oxide in contact with a second portion based on said metal oxide, the first portion being semiconductor and the second portion being electrically insulating.

According to an embodiment, the metal oxide is selected from the group comprising zinc oxide (ZnO), indium oxide ($In_2O_3$), indium zinc oxide (In—Zn—O), In—X—Zn—O oxides, where X is selected from the group comprising gallium (Ga), antimony (Sb), tin (Sn), magnesium (Mg), beryllium (Be), yttrium (Y), silver (Ag), aluminum (Al), calcium (Ca), and nickel (Ni), and Sn—X—Zn—O oxides, where X is selected from the group comprising gallium (Ga), antimony (Sb), magnesium (Mg), beryllium (Be), yttrium (Y), silver (Ag), aluminum (Al), calcium (Ca), and nickel (Ni).

According to an embodiment, the device comprises, on a substrate, a stack of the first portion and of the second portion.

According to an embodiment, the first portion and the second portion are in contact with a substrate.

According to an embodiment, the device comprises a field-effect transistor comprising a gate insulator corresponding to the second portion and a channel region formed in the first portion.

According to an embodiment, the device comprises a MIS capacitor comprising first and second electrodes separated by a dielectric portion, the first portion corresponding to the first electrode or to the second electrode and the second portion corresponding to the dielectric portion.

An embodiment also provides a method of manufacturing an electronic device comprising forming at least a first portion and a second portion of a metal oxide by a sol-gel method, heating the first portion up to a temperature higher than a first temperature so that the first portion becomes semiconductor and heating the second portion up to a temperature lower than a second temperature, the second temperature being lower than the first temperature, so that the second portion becomes electrically insulating.

According to an embodiment, the method comprises the steps of:

(a) forming the second portion by a sol-gel method and heating the second portion up to a temperature lower than the second temperature; and (b) forming the first portion by a sol-gel method and heating the first portion up to a temperature higher than the first temperature.

According to an embodiment, the method comprises the steps of:

forming a layer of said metal oxide by a sol-gel method;

locally heating said layer up to a temperature higher than the first temperature to form the first portion; and heating the layer up to a temperature lower than the second temperature to form the second portion.

According to an embodiment, the local heating step is carried out by laser or ultraviolet radiation.

According to an embodiment, the metal oxide is selected from the group comprising zinc oxide (ZnO), indium oxide ($In_2O_3$), indium zinc oxide (In—Zn—O), In—X—Zn—O oxides, where X is selected from the group comprising gallium (Ga), antimony (Sb), tin (Sn), magnesium (Mg), beryllium (Be), yttrium (Y), silver (Ag), aluminum (Al), calcium (Ca), and nickel (Ni), and Sn—X—Zn—O oxides, where X is selected from the group comprising gallium (Ga), antimony (Sb), magnesium (Mg), beryllium (Be), yttrium (Y), silver (Ag), aluminum (Al), calcium (Ca), and nickel (Ni).

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
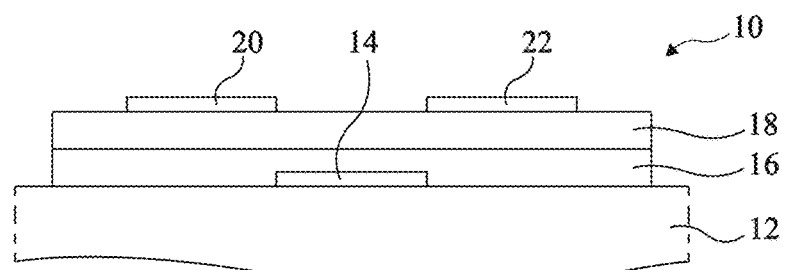
FIGS. 1 and 2 are cross-section views of embodiments of field-effect transistors.

For clarity, the same elements have been designated with the same reference numerals in the various drawings and, further, the various drawings are not to scale. In the following description, expressions "substantially", "around", and "approximately" mean "to within 10%". Further, "layer mainly formed of a material" or "layer based on a material" means that a layer comprises a proportion greater than or equal to 95% of said material, this proportion being preferably greater than 99%.

In the following description, a material having a resistivity greater than $10^5$ Ω·m is called electrically-insulating material and a material having an electric resistivity in the range from 0.1 Ω·m and $10^3$ Ω·m is called semiconductor material.

The sol-gel method is a method of manufacturing an inorganic polymer comprising a succession of hydrolysis and condensation reactions, at mild temperatures (generally between 20° C. and 150° C.), to obtain oxide lattices. The oxide lattice forms in a solution. The chemical reactions having the method based thereon are started when precursors are placed in the presence of water: the hydrolysis of the precursors first occurs, after which the condensation of the hydrolyzed products results in gelling the system. Before the gelling, the colloidal solution of particles (having a diameter in the range from 1 to 1,000 nanometers), where the hydrolysis and condensation reactions occur, is called sol.

According to an embodiment of a method of manufacturing an electronic device comprising an insulating portion in contact with a semiconductor portion, the insulating portion and the semiconductor portion are formed from a same metal oxide obtained according to a sol-gel method. The insulating or semiconductor character is obtained by modifying the conditions of the drying of the metal oxide portion and particularly the drying temperature. Indeed, the inventors have shown that, to obtain a semiconductor portion, the drying step is carried out at a temperature higher than a first threshold temperature and that, to obtain an insulating portion, the drying step is carried out at a temperature lower than a second threshold temperature lower than the first threshold temperature. Since the semiconductor portion and the insulating portion are based on the same metal oxide, the interface between the semiconductor portion and the insulating portion then has few defects.

FIGS. 1 to 4 illustrate embodiments of electronic devices for which the embodiment of the previously-described manufacturing method may be implemented.

FIG. 1 is a cross-section view of an embodiment of an electronic device 10 comprising a so-called "low gate" field-effect transistor. Electronic device 10 comprises, from bottom to top:

a substrate 12;

a conducting portion 14 on substrate 12;

an insulating layer 16 covering conducting portion 14 and substrate 12;

a semiconductor layer 18 covering insulating layer 16; and conducting portions 20, 22 on semiconductor layer 18.

Conducting portion 14 forms the transistor gate. Insulating layer 16 corresponds to the transistor gate. Conducting portions 20 and 22 form the drain and source contacts of the transistor. The transistor channel is formed in semiconductor layer 18.

The thickness of substrate 12 may be in the range from 5 µm to 1,000 µm. Substrate 12 may be a rigid substrate or a flexible substrate. An example of a rigid substrate comprises a silicon, germanium, or glass substrate. Preferably, substrate 12 is a flexible film. An example of flexible substrate comprises a film of PEN (polyethylene naphthalate), PET (polyethylene terephthalate), PI (polyimide), or PEEK (polyetheretherketone). Substrate 12 may have a thickness from 10 µm to 300 µm and may have a flexible behavior, that is, substrate 12 may, under the action of an external force, deform, and particularly bend, without breaking or tearing.

Conducting portions 14, 20, 22 may have a thickness in the range from 20 nm to 100 nm. They may be made of aluminum tin oxide, of a metallic material, particularly of silver, of gold, of nickel, of palladium, of aluminum, or of an alloy or a mixture of at least two of the materials, of a conducting polymer, for example, PEDOT:PSS (poly(3,4-ethylenedioxythiophene):poly(styrene sulfonate)).

Insulating layer 16 has a thickness in the range from 100 nm to 500 nm.

Semiconductor layer 18 has a thickness in the range from 5 nm to 40 nm.

Insulating layer 16 and semiconductor layer 18 are based on a same metal oxide.

Insulating layer 16 and semiconductor layer 18 are based on a metal oxide capable of having a semiconductor behavior. Examples of such metal oxides are:

zinc oxide (ZnO);

indium oxide ($In_2O_3$);

indium zinc oxide (In—Zn—O);

In—X—Zn—O oxides, where X is selected from the group comprising gallium (Ga), antimony (Sb), tin (Sn), magnesium (Mg), beryllium (Be), yttrium (Y), silver (Ag), aluminum (Al), calcium (Ca), and nickel (Ni); and Sn—X—Zn—O oxides, where X is selected from the group comprising gallium (Ga), antimony (Sb), magnesium (Mg), beryllium (Be), yttrium (Y), silver (Ag), aluminum (Al), calcium (Ca), and nickel (Ni).

Figure 2:
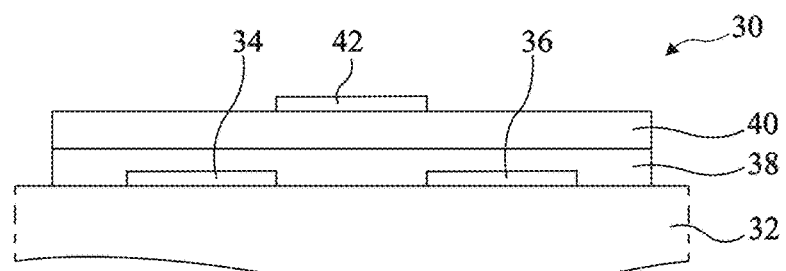

FIG. 2 is a cross-section view of an embodiment of an electronic device 30 comprising a so-called "high gate" field-effect transistor. Electronic device 10 comprises, from bottom to top:

a substrate 32;

conducting portions 34, 36 on substrate 32;

a semiconductor layer 38 covering conducting portions 34, 36, and substrate 32;

an insulating layer 40 covering semiconductor layer 38; and a conducting portion 42 on insulating layer 40.

Substrate 32, conducting portions 34, 36, 42, semiconductor layer 38, and insulating layer 40 may have the same characteristics, particularly the same compositions, as those previously described respectively for substrate 12, conducting portions 20, 22, 14, semiconductor layer 18, and insulating layer 16.

Figure 3:
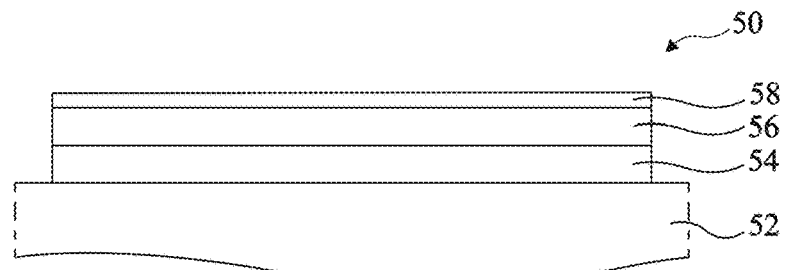
FIG. 3 is a cross-section view of an embodiment of a metal-insulator-semiconductor capacitor.

FIG. 3 is a cross-section view of an embodiment of an electronic device 50 comprising a MIS capacitor. Electronic device 50 comprises, from bottom to top:

a substrate 52;

a semiconductor layer 54 covering substrate 52;

an insulating layer 56 covering semiconductor layer 54; and a conducting portion 58 covering insulating layer 56.

Substrate 52, conducting portion 58, semiconductor layer 54, and insulating layer 56 may have the same characteristics, particularly the same compositions, as those previously described respectively for substrate 12, conducting portion 14, semiconductor layer 18, and insulating layer 16.

Figure 4:
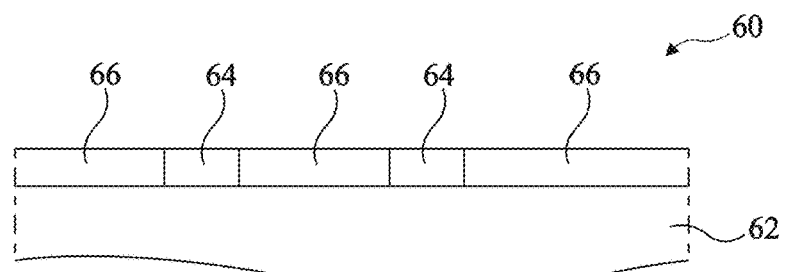
FIG. 4 is a cross-section view of an embodiment of laterally-insulated semiconductor tracks.

FIG. 4 is a cross-section view of an embodiment of an electronic device 60 comprising from bottom to top:

a substrate 62;

semiconductor portions 64 resting on substrate 62; and insulating portions 66 resting on the substrate and extending between semiconductor portions 64.

Substrate 62, each semiconductor portion 64, and each insulating portion 66 may have the same characteristics, particularly the same compositions, as those previously described respectively for substrate 12, semiconductor layer 18, and insulating layer 16.

Figure 5A:
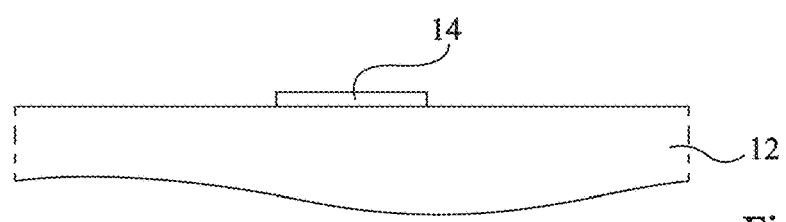
FIGS. 5A to 5C are cross-section views of structures obtained at successive steps of an embodiment of a method of manufacturing the field-effect transistor shown in FIG. 1.
Figure 5B:
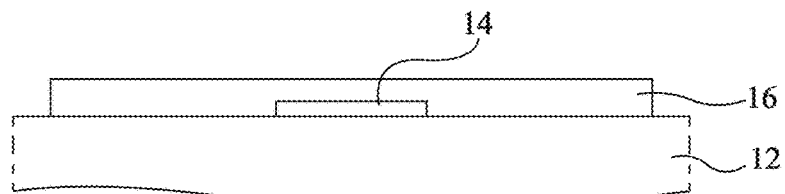
Figure 5C:
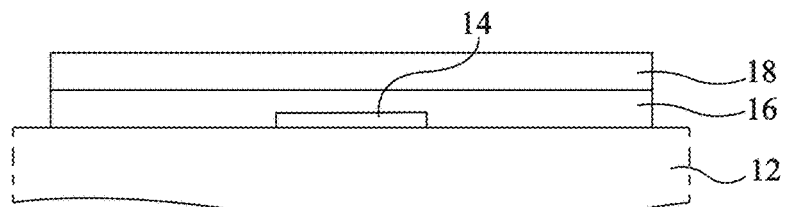

FIGS. 5A to 5C illustrate successive steps of an embodiment of a method of manufacturing the field-effect transistor shown in FIG. 1.

FIG. 5A shows the structure obtained after the forming of conducting portion 14 on substrate 12. Conducting portion 14 may be deposited by silk-screening or by inkjet.

FIG. 5B shows the structure obtained after the forming of insulating layer 16 implementing a sol-gel method.

The forming of insulating layer 16 may comprise a step of preparing a sol containing the metal oxide forming layer 16, a sol deposition step, and a gel drying step.

The sol preparation step may comprise preparing a solution comprising precursors of the metal oxide. The precursors may be metal alcoxides and/or metal salts.

As an example, in the case where the metal oxide is IGZO, the zinc precursor may be zinc acetate dihydrate $(Zn(CH_3COO)_2.2H_2O)$, the gallium precursor may be gallium nitrate hydrate $(Ga(NO_3)_3.xH_2O)$, and the indium precursor may be indium acetate hydrate $(In(CH_3COO)_3.H_2O)$, where these precursors may be provided in the form of powders. The precursors are added to a solvent to form the sol. The sol may further comprise a dispersant. The precursor hydrolysis and hydrolyzed compound condensation reactions lead to the forming of a three-dimensional lattice of the metal oxide. An increase in the viscosity of the sol until the gel is obtained can be observed. Preferably, the step of forming layer 16 is carried out before obtaining the gel, when the sol has the desired viscosity. According to an embodiment, the gel is translucent and comprises no agglomerates visible to the naked eye.

According to an embodiment, the sol preparation step may be performed at a temperature in the range from 20° C. to 100° C.

The method of forming layer 16 may correspond to a so-called additive method, for example, by direct printing of the sol at the desired locations, for example, by inkjet printing, photogravure, silk-screening, flexography, spray coating, or drop casting. The method of forming layer 16 may correspond to a so-called subtractive method, where the sol is deposited all over the structure and where the non-used portions are then removed, for example, by photolithography or laser ablation. According to the considered material, the deposition over the entire structure may be performed by spin coating, spray coating, photogravure, slot-die coating, blade coating, flexography, or silk-screening.

The drying step is carried out at a temperature lower than a second threshold temperature below which an electrically-insulating material is obtained. As an example, for IGZO, the second threshold temperature is in the order of 350° C. and the drying step is carried out at a temperature in the range from 200° C. to 350° C., preferably from 250° C. to 350° C. The drying may last for from 4 minutes to 1 hour. The drying may be carried out in an oven at the ambient atmosphere.

The inventors have shown that for such a drying temperature, the material based on metal oxide finally obtained is an electric insulator. An explanation would be that, due to the low temperature of the drying, the gel disorganizes by the migration of chemical species. Further, certain elements, originating from the precursors, may be kept in the gel and favor the insulating character.

FIG. 5C shows the structure obtained after the forming of semiconductor layer 18 implementing a sol-gel method.

The forming of semiconductor layer 18 may comprise a step of preparing a sol containing the metal oxide which forms layer 18, a sol deposition step, and a gel drying step.

The sol may be prepared as previously described in relation with the forming of insulating layer 16. Preferably, the sol used to form insulating layer 16 has the same composition as the sol used to form semiconductor layer 18. The sol used to form semiconductor layer 18 may be deposited according to the deposition methods previously described for the forming of insulating layer 16.

According to an embodiment, it may be advantageous to form semiconductor layer 18 by successive depositions of elementary semiconductor layers forming a stack, each deposition being followed by a drying before the deposition of the next layer. As an example, each elementary semiconductor layer may have, after drying, a thickness in the range from 5 nm to 10 nm.

The drying step is carried out at a temperature higher than a first threshold temperature, higher than the second threshold temperature. As an example, for IGZO, the first threshold temperature is in the order of 370° C. and the drying step is carried out at a temperature in the range from 370° C. to 500° C., preferably from 400° C. to 450° C. The drying may last for from 4 minutes to 1 hour.

According to an embodiment, the temperature rise from the sol deposition temperature up to the drying temperature lasts for less than a few seconds.

The inventors have shown that for such a drying temperature, the material based on metal oxide finally obtained is a semiconductor. An explanation would be that, due to the high drying temperature, the ordered structure of the gel rapidly sets. Further, elements originating from the precursors, capable of favoring the electrically-insulating character, tend to substantially totally leave the gel by evaporation.

Further, the inventors have shown that, although the drying temperature used to form semiconductor layer 18 is higher than the drying temperature which has been used to form insulating layer 16 at the previous step, layer 16 keeps its electrically-insulating character. Insulating layer 16 can thus be formed before semiconductor layer 18.

Figure 6:
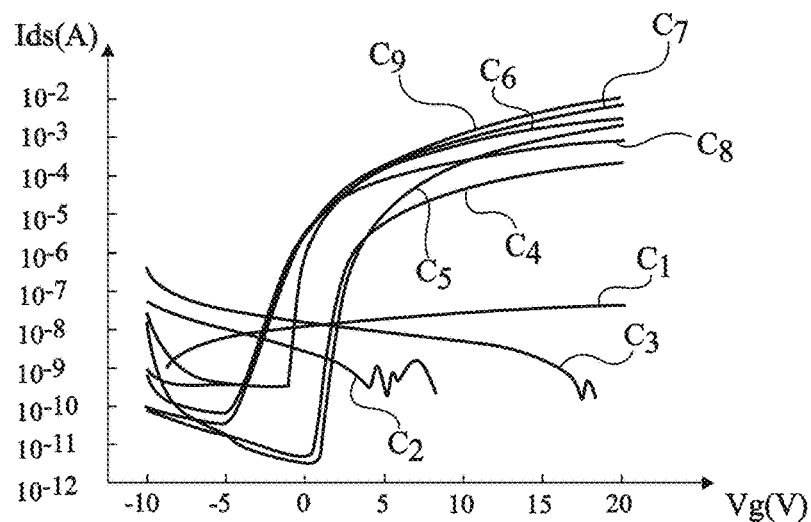
FIG. 6 shows curves of the variation of the drain current according to the gate voltage of field-effect transistors formed according to the manufacturing method embodiment illustrated in FIGS. 5A to 5C for different drying temperatures of the semiconductor layer.

FIG. 6 shows curves $C_1$ to $C_9$ of variation of drain current Ids of a field-effect transistor according to gate voltage Vd, the transistor having the structure shown in FIG. 1 and having been formed according to the manufacturing method previously described in relation with FIGS. 5A to 5C. To obtain curves $C_1$ to $C_9$, substrate 12 is silicon and has a 750-μm thickness. Conductive portions 20, 22 are made of gold and portion 14 is made of aluminum. Portions 14, 20, 22 each have a 40-nm thickness. Insulating layer 16 has a 100-nm thickness. Semiconductor layer 18 has a 15-nm thickness. Insulating layer 16 and semiconductor layer 18 have been formed from a sol prepared by mixing 30 mg of $Zn(CH_3COO)_2 \cdot 2H_2O$ powder, 5 mg of $Ga(NO_3)_3 \cdot xH_2O$ powder, 15 mg of $In(CH_3COO)_3 \cdot H_2O$ powder, 10 ml of 2-methoxyethanol, and 0.5 ml of ethanolamine. The solution has been stirred for 12 hours at 70° C. Insulating layer 16 has been deposited by inkjet printing in one go. Semiconductor layer 18 has been deposited by inkjet printing by a plurality of successive depositions, each deposition being followed by a drying step before the next deposition. The channel length of the transistor is 20 μm.

The drying temperature for the forming of insulating layer 16 is 300° C. and the drying time for the forming of insulating layer 16 is 1 hour for all curves $C_1$ to $C_9$. The drying time for the forming of semiconductor layer 18 is 450° C. for all curves $C_1$ to $C_9$. Table (1) hereafter indicates, for each curve $C_1$ to $C_9$, the drying temperature used to form semiconductor layer 18 and the voltage Vds applied between the drain and the source of the transistor.

TABLE 1

| | Curves | | | | | | | | |
|---|---|---|---|---|---|---|---|---|---|
| | 1 | 2 | 3 | 4 | 5 | 6 | 7 | 8 | 9 |
| Drying temperature (° C.) | 00 | 00 | 00 | 50 | 50 | 80 | 80 | 50 | 50 |
| Vds (V) | 0 | | 0 | | 0 | | 0 | | 0 |

Curves $C_4$ to $C_9$ are characteristic of a field-effect transistor, which effectively reflects the fact that layer 16 is made of an insulating material while layer 18 is made of a semiconductor material.

Curves $C_1$ to $C_3$ show a lack of conduction of the MOS transistor, which means that the material forming layer 18 has an insulating behavior, rather than a semiconductor behavior.

Figure 7:
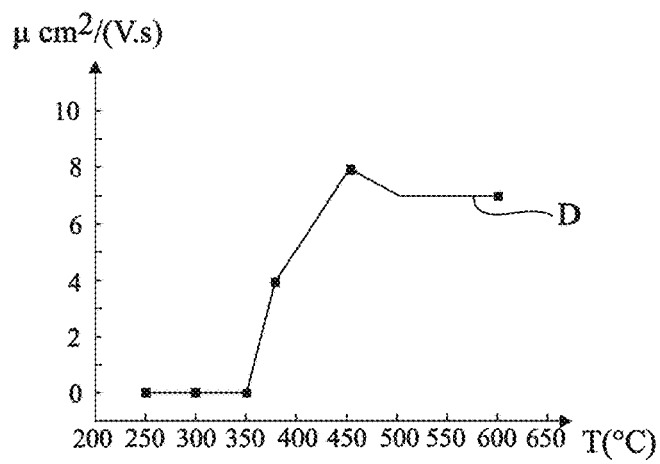
FIG. 7 shows a curve of the variation of the mobility of electrons according to the temperature of the semiconductor layer formed according to the manufacturing method embodiment illustrated in FIGS. 5A to 5C for different drying temperatures of the semiconductor layer.

FIG. 7 shows a curve D of variation of electron mobility μ in semiconductor layer 18 according to the drying temperature used to form this layer, layer 18 having been prepared according to the method previously-described in relation with FIG. 6. Electron mobility μ is substantially equal to 0 when the drying temperature of curve 18 is lower than 350° C. and electron mobility μ is greater than 4 $cm^2/(V \cdot s)$ when the drying temperature of layer 18 is higher than 370° C. This means that the material forming layer 18 behaves as an electric insulator when the drying temperature for the forming of layer 18 is lower than approximately 350° C. and behaves as a semiconductor when the drying temperature for the forming of the layer is higher than approximately 370° C.

Figure 8A:
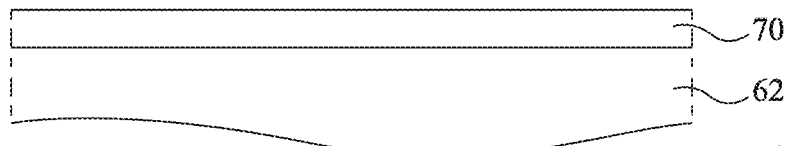
FIGS. 8A to 8C are cross-section views of structures obtained at successive steps of an embodiment of a method of manufacturing the electronic device shown in FIG. 4.
Figure 8B:
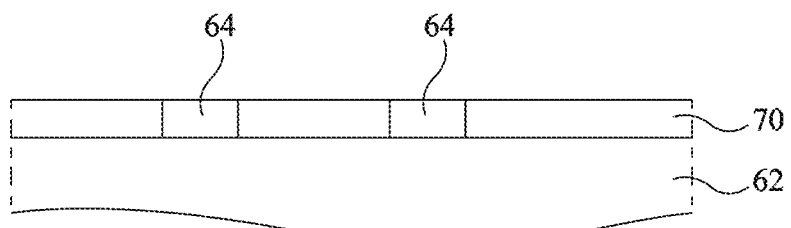
Figure 8C:
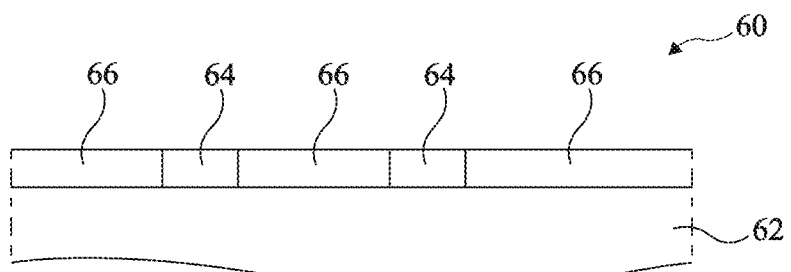

FIGS. 8A to 8C are cross-section views of structures obtained at successive steps of an embodiment of a method of manufacturing electronic device 60 shown in FIG. 4.

FIG. 8A shows the structure obtained after the deposition of a layer 70 of a sol such as previously-described on substrate 62.

FIG. 8B shows the structure obtained after a step of local heating of layer 70 to form semiconductor portions 64. The heating step may comprise briefly heating layer 70 at the locations where semiconductor portions 64 are desired. The local heating may be carried out by means of a laser, particularly an excimer laser having a power in the order of 100 watts. The local heating may be carried out by an ultraviolet radiation (UV) through a mask, particularly at least one short ultraviolet pulse by means of the equipment commercialized under trade name PulseForge by Novacentrix or under trade name Sinteron 2000 by Xenon Corporation. A plurality of ultraviolet flashes may be provided. UV radiation means a radiation having its wavelengths at least partly in the range from 200 nm to 400 nm. As an example, the ultraviolet radiation is applied with short pulses, for example, between 500 μs and 3 ms, with a fluence in the range from 1 $J/cm^2$ et 30 $J/cm^2$.

By these various means, the temperature of semiconductor portions 64 in layer 70 is very briefly taken to a temperature higher than 370° C. The heating is sufficiently intense and short for the temperature of the rest of layer 70 not to rise above 370° C.

FIG. 8C shows the structure obtained after a step of general heating of layer 70 up to a temperature lower than 350° C. to form insulating portions 66.

According to a variation, the operations previously described in relation with FIGS. 8A to 8C may be repeated a plurality of times to obtain semiconductor portions 64 having the desired thickness.

The invention claimed is:

1. A method of manufacturing an electronic device comprising:
    forming a metal oxide by a sol-gel method,
    forming at least a first portion and a second portion from the metal oxide,
    heating the first portion up to a temperature higher than a first temperature so that the first portion becomes semiconductor and
    heating the second portion up to a temperature lower than a second temperature equal to 350° C. and higher than a third temperature equal to 200° C., the second temperature being lower than the first temperature, so that the second portion becomes electrically insulating.

2. The method of claim 1, wherein, before heating the first portion and heating the second portion, the first portion and the second portion have the same composition.

3. The method of claim 1, comprising the steps of:
    forming a layer of the metal oxide;
    locally heating the layer up to a temperature higher than the first temperature to form the first portion; and
    heating the layer up to a temperature lower than the second temperature to form the second portion.

4. The method of claim 3, wherein the local heating step is carried out by laser or ultraviolet radiation.

5. The method of claim 1, wherein the metal oxide is selected from the group comprising zinc oxide, indium oxide, indium zinc oxide, and In—X—Zn—O oxides, where X is selected from the group comprising gallium, antimony, tin, magnesium, beryllium, yttrium, silver, aluminum, calcium, and nickel.

6. An electronic device formed according to the method of claim 1, comprising the first portion formed from said metal oxide in contact with the second portion formed from said metal oxide, the first portion being semiconductor and the second portion being electrically insulating.

7. The electronic device of claim 6, comprising, on a substrate, a stack of the first portion and of the second portion.

8. The electronic device of claim 6, wherein the first portion and the second portion are in contact with a substrate.

9. The electronic device of claim 6, comprising a field-effect transistor comprising a gate insulator corresponding to the second portion and a channel region formed in the first portion.

10. The electronic device of claim 6, comprising a MIS capacitor comprising first and second electrodes separated by a dielectric portion, the first portion corresponding to the first electrode or to the second electrode and the second portion corresponding to the dielectric portion.

11. The method of claim 1, wherein forming the first portion comprises successive depositions of layers of the metal oxide, each deposition being followed by a drying step before a next deposition of one of the layers.

* * * * *